United States Patent
Van Der Zouw (10) Patent No.: US 6,891,598 B2
(45) Date of Patent: May 10, 2005

(54) LITHOGRAPHIC DEVICE AND METHOD FOR WAFER ALIGNMENT WITH REDUCED TILT SENSITIVITY

(75) Inventor: Gerbrand Van Der Zouw, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 10/776,640

(22) Filed: Feb. 12, 2004

(65) Prior Publication Data
US 2004/0179181 A1 Sep. 16, 2004

(30) Foreign Application Priority Data
Feb. 14, 2003 (EP) .......................................... 03075431

(51) Int. Cl.[7] ........................ G03B 27/54; G03B 27/42
(52) U.S. Cl. ........................................ 355/67; 355/53
(58) Field of Search ....................... 355/53, 55, 67–71; 356/399–401; 250/548

(56) References Cited

U.S. PATENT DOCUMENTS

| | | | |
|---|---|---|---|
| 4,251,160 A | * | 2/1981 | Bouwhuis et al. .......... 356/401 |
| 5,673,101 A | * | 9/1997 | Tenner et al. ................. 355/53 |
| 5,917,604 A | | 6/1999 | Dirksen et al. |
| 6,730,920 B2 | * | 5/2004 | Groeneveld et al. ..... 250/491.1 |
| 2001/0008273 A1 | | 7/2001 | Groeneveld et al. |

* cited by examiner

Primary Examiner—Henry Hung Nguyen
(74) Attorney, Agent, or Firm—Pillsbury Winthrop LLP (57) ABSTRACT

A wafer or substrate alignment system for a lithographic apparatus, capable of exhibiting reduced tilt sensitivity, is presented herein. In particular, the substrate alignment system detects a position of a substrate relative to a position of a patterning device and includes a source configured to generate an incoming optical beam, at least one grating, provided on the substrate, having a diffracting length, in which the at least one grating is configured to generate at least one diffraction order of constituent diffracted beams based on an interaction with the incoming optical beam over the diffracting length. The system further includes an optical device, configured to image the at least one diffracted order on a sensor device, and includes aperture at a predetermined location to allow the constituent diffracted beams to pass through. The optical device is arranged to broaden the constituent diffracted beams such that a beam diameter of the constituent diffracted beams is larger than a diameter of the aperture, in order to reduce the sensitivity to tilt.

26 Claims, 4 Drawing Sheets

LITHOGRAPHIC DEVICE AND METHOD FOR WAFER ALIGNMENT WITH REDUCED TILT SENSITIVITY

BACKGROUND OF THE INVENTION

1. Priority Information

This application claims priority from European Patent Application No.03075431.1, filed Feb. 14, 2003, herein incorporated by reference in its entirety.

2. Field of the Invention

The present invention relates to lithographic apparatus lithographic apparatus comprising a device for wafer alignment with reduced tilt sensitivity.

3. Description of the Related Art

Lithographic apparatus can be used, for example, in the manufacture of integrated circuits (ICs). In such a case, a patterning device may generate a desired circuit pattern corresponding to an individual layer of the IC, and this pattern can be imaged onto a target portion (e.g. comprising one or more dies) on a substrate (silicon wafer) that has been coated with a layer of radiation-sensitive material (resist).

Generally, such apparatus include an illumination system for supplying a projection beam of radiation, a support structure for supporting the patterning device, a substrate holder for holding a substrate, and a projection system for projecting the patterned beam onto a target portion of the substrate. More information with regard to lithographic devices as here described can be gleaned, for example, from U.S. Pat. No. 6,046,792, incorporated herein by reference.

The term "patterning device" as employed herein should be broadly interpreted as referring to a mechanism that can be used to endow an incoming radiation beam with a patterned cross-section, corresponding to a pattern that is to be created in a target portion of the substrate; the term "light valve" can also be used in this context. Generally, the pattern will correspond to a particular functional layer in a device being created in the target portion, such as an integrated circuit or other device (see below). Examples of such a patterning device include:

mask: the concept of a mask is well known in lithography, and it includes mask types such as binary, alternating phase-shift, and attenuated phase-shift, as well as various hybrid mask types. Placement of such a mask in the radiation beam causes selective transmission (in the case of a transmissive mask) or reflection (in the case of a reflective mask) of the radiation impinging on the mask, according to the pattern on the mask. In the case of a mask, the support structure will generally be a mask table, which ensures that the mask can be held at a desired position in the incoming radiation beam, and that it can be moved relative to the beam if so desired;

programmable mirror array: an example of such a device is a matrix-addressable surface having a visco-elastic control layer and a reflective surface. The basic principle behind such an apparatus is that (for example) addressed areas of the reflective surface reflect incident light as diffracted light, whereas unaddressed areas reflect incident light as undiffracted light. Using an appropriate filter, the said undiffracted light can be filtered out of the reflected beam, leaving only the diffracted light behind; in this manner, the beam becomes patterned according to the addressing pattern of the matrix-addressable surface. The required matrix addressing can be performed using suitable electronic means. More information on such mirror arrays can be gleaned, for example, from U.S. Pat. Nos. 5,296,891 and 5,523,193, which are incorporated herein by reference. In the case of a programmable mirror array, the said support structure may be embodied as a frame or table, for example, which may be fixed or movable as required; and programmable LCD array: an example of such a construction is given in U.S. Pat. No. 5,229,872, which is incorporated herein by reference. As above, the support structure in this case may be embodied as a frame or table, for example, which may be fixed or movable as required.

For purposes of simplicity, the rest of this text may, at certain locations, specifically direct itself to examples involving a mask and mask table; however, the general principles discussed in such instances should be seen in the broader context of the patterning device as set forth above.

In general, a single wafer will contain a whole network of adjacent target portions that are successively irradiated via the projection system, one at a time. In current apparatus, employing patterning by a mask on a mask table, a distinction can be made between two different types of machine. In one type of lithographic apparatus—commonly referred to as a wafer stepper—each target portion is irradiated by exposing the entire mask pattern onto the target portion in one go. In an alternative apparatus—commonly referred to as a step-and-scan apparatus—each target portion is irradiated by progressively scanning the mask pattern under the projection beam in a given reference direction (the "scanning" direction) while synchronously scanning the substrate table parallel or anti-parallel to this direction. Because, typically, the projection system will have a magnification factor M (generally <1), the speed V at which the substrate table is scanned will be a factor M times that at which the mask table is scanned. More information with regard to lithographic devices as here described can be gleaned, for example, from U.S. Pat. No. 6,046,792, incorporated herein by reference.

In a manufacturing process using a lithographic apparatus, the pattern is imaged onto a substrate that is at least partially covered by a layer of radiation-sensitive material (resist). Prior to this imaging step, the substrate may undergo various procedures, such as priming, resist coating and a soft bake. After exposure, the substrate may be subjected to other procedures, such as a post-exposure bake (PEB), development, a hard bake and measurement/inspection of the imaged features. This array of procedures is used as a basis to pattern an individual layer of a device, e.g. an IC. Such a patterned layer may then undergo various processes such as etching, ion-implantation (doping), metallization, oxidation, chemo-mechanical polishing, etc., all intended to finish off an individual layer.

If several layers are required, then the whole procedure, or a variant thereof, will have to be repeated for each new layer. Eventually, an array of devices will be present on the substrate (wafer). These devices are then separated from one another by a technique such as dicing or sawing, whence the individual devices can be mounted on a carrier, connected to pins, etc. Further information regarding such processes can be obtained, for example, from the book "Microchip Fabrication: A Practical Guide to Semiconductor Processing", Third Edition, by Peter van Zant, McGraw Hill Publishing Co., 1997, ISBN 0-07-067250-4, incorporated herein by reference.

For the sake of simplicity, the projection system may hereinafter be referred to as the "lens"; however, this term should be broadly interpreted as encompassing various types of projection system, including refractive optics, reflective optics, and catadioptric systems, for example. The radiation system may also include components operating according to any of these design types for directing, shaping or controlling the projection beam of radiation, and such components may also be referred to below, collectively or singularly, as a "lens". Further, the lithographic apparatus may be of a type having two or more substrate tables (and/or two or more mask tables). In such "multiple stage" devices the additional tables may be used in parallel, or preparatory steps may be carried out on one or more tables while one or more other tables are being used for exposures. Twin stage lithographic apparatus are described, for example, in U.S. Pat. No. 5,969,441 and WO 98/40791, incorporated herein by reference.

Further, the lithographic apparatus may be of a type having two or more substrate tables (and/or two or more mask tables). In such "multiple stage" devices the additional tables may be used in parallel, or preparatory steps may be carried out on one or more tables while one or more other tables are being used for exposures. Dual stage lithographic apparatus are described, for example, in U.S. Pat. No. 5,969,441 and WO 98/40791, both incorporated herein by reference.

For a lithographic process the alignment between the wafer to be processed and the mask pattern on the mask should be as precise as possible for a correct definition of features on the substrate, particularly when the features are subject to pre-specified sizes having specified tolerances. To this end, the lithographic apparatus comprises a wafer alignment module, which provides for alignment of the substrate with the mask and mask pattern within a given (specified) tolerance. The wafer alignment system typically performs the alignment based on optical means.

The position of a wafer or a portion of a wafer is determined by measuring an optical response from an optical marker which is illuminated by an optical source. For example, a grating is illuminated by a laser beam, the laser beam diffracts from the grating, and one or more of the diffracted orders are measured by respective sensors (for example a detector array), which are typically located on a reference plane. Using the output of the sensors the position of the wafer can be derived (relative to the reference plane).

In the prior art wafer alignment systems based on gratings using a Keplerian telescope are known. U.S. Pat. No. 4,251,160 discloses a wafer alignment system, which comprises a Keplerian telescope for imaging diffracted beams generated by a grating on one or more detectors to obtain information on the alignment of a wafer relative to a reference.

A signal from a marker on a wafer (portion) is projected by the telescope system on the reference plane. To fulfill the imaging condition, the object plane (where the marker is located) should be the conjugate plane of the image. Disadvantageously, a marker on a wafer which is not in the object plane, shows a shift in the reference plane, when the marker is tilted relative to the object plane. The shift is due to the defocus of the marker, a tilted marker in focus (i.e., in the object plane) will not display a shift in the reference plane of the wafer alignment system.

Moreover, in a prior art Keplerian telescope, a diaphragm aperture (i.e., a pinhole) is applied which is positioned in between the telescope lenses. The diaphragm serves to reduce stray light from reaching the sensor and, as a consequence, parallax of a projected image. WO97/35234 discloses a wafer alignment system having a diaphragm which comprises a plurality of pinholes which are located at predetermined positions in the plane of intermediate focus where the focus of each diffraction order is expected in the ideal case of an untilted grating. In the prior art this arrangement is used for spatial filtering of the diffraction orders to obtain information from each individual order.

As noted above, during semiconductor manufacturing processes, a wafer is subjected to a plurality of treatments such as annealing, etching, polishing, etc., which may likely cause a roughness of a marker (a recessed area in the marker and/or warping of the marker). Such marker roughness may cause an uncontrolled (local) tilt of the marker and, consequently, a shift of the marker image on the reference plane for a defocused marker. The combination of tilt and defocus causes a position error of the image which may contribute to an overlay error in the construction of a semiconductor device. For suppression of the undesired shift the reference marker must be placed at the object plane with great accuracy (focus calibration). Such focus calibration is non-trivial as will be appreciated by persons skilled in the art.

Typically, a prior art wafer alignment system would have a defocus in the order of about hundred micrometers. A grating (i.e., a marker) on a wafer would typically display a tilting angle in the order of at least 100 $\mu$rad. Such tilting angle is due to a large extent due to the surface flatness quality of the wafer, which displays some roughness caused by the manufacturing process. Thus, the tilting angle may vary randomly, the Figure given above is an estimate of the average.

In a prior art wafer alignment system with such values for defocus and tilting angle, the position error or accuracy of alignment is about 20 nanometers (or 3.5 $\mu$m/degree).

A tilt of a marker will for a given diffraction order produced by the marker cause a shift of the diffraction angle (relative to the situation of a tilt-free marker). When using a diaphragm, this will lead to a displacement of the diffracted beam (for each diffraction order) relative to the predetermined pinholes.

Further, in a wafer alignment system using a grating with multiple diffracted beams (diffraction orders) and/or multiple colors, the images of the diffraction orders and/or colors are usually not projected in the same plane due to optical aberrations ("focus differences"). When multiple diffraction orders and/or colors are measured simultaneously, marker roughness results in order-to-order and/or color-to-color differences, respectively, in measured positions of the images, thereby degrading performance of the alignment procedure. Depending on the respective values of defocus and tilting angle for each individual order and/or color, some orders may not be usable.

For improvement of wafer alignment with reduced tilt sensitivity in lithographic apparatus, a prior art Abbe arm calibration system for a Keplerian telescope is disclosed in U.S. Publication No. 2001/0008273 A1, which is relatively complex and cost-ineffective.

Tilt sensitivity is defined as the proportionality between a tilt of an object and a tilt of an image of that object.

A more detailed explanation of the relation between wafer tilt and the sensitivity of detection of the diffracted beams will be described below in the description of embodiments according to the present invention.

SUMMARY OF THE INVENTION

The principles of the present invention, as embodied and broadly described herein, provide for a lithographic apparatus comprising a device for wafer alignment with reduced tilt sensitivity. In one embodiment, the lithographic apparatus comprises a radiation system for providing a beam of radiation, a patterning device to impart a desired pattern onto the beam of radiation along its cross-section, a substrate holder for holding a substrate, and a substrate alignment system for detecting a position of the substrate relative to a position of the patterning device. The substrate alignment system comprises a source configured to generate an incoming optical beam, at least one grating, provided on the substrate, having a diffracting length, the at least one grating configured to generate at least one diffraction order of constituent diffracted beams based on an interaction with the incoming optical beam over the diffracting length, and an optical device configured to image the at least one diffracted order on a sensor device. The optical device includes an aperture at a predetermined location to allow the constituent diffracted beams to pass through wherein the optical device is arranged to broaden the constituent diffracted beams such that a beam diameter of the constituent diffracted beams is larger than a diameter of the aperture in order to reduce the sensitivity to tilt.

In this embodiment, a wafer alignment device with reduced tilt sensitivity with respect to (local or wafer-wide) tilt of an optical marker on a wafer or portion thereof is achieved. That is, the wafer alignment system becomes less sensitive to tilt of a marker. Each diffracted beam is still partially transmitted through the pinholes of the aperture.

The lithographic apparatus is characterized in that the optical device is arranged for broadening the constituent diffracted beams. The broadening is caused by the finite size effect brought about by the diffracting length of the grating, i.e., the portion of the grating where the interaction of the incoming optical beam with the periodic structure of the grating takes place. Due to the broadening, a portion of the diffracted beams are allowed to pass the aperture, and the sensitivity to tilt of wafer alignment system is significantly reduced.

Also, the present invention provides a solution for correction of a tilt of an incoming laser beam which would cause a similar undesired effect as a tilted marker. By means of the present invention the sensitivity of the wafer alignment system in respect of a tilt of the incoming laser beam is also significantly reduced.

The present invention relates to a wafer alignment system and method for with reduced tilt sensitivity in a lithographic apparatus.

Moreover, in the present invention, the tilt sensitivity as a function of beam broadening is used to separate the dependency of the image shift of a marker on Abbe arm and on defocus.

The tilt sensitivity varies with the broadening of the diffraction beams as generated by (the diameter of) the measurement beam of the wafer alignment system.

The method according to present invention allows measuring a defocus of an alignment system and/or the wafer marker pivot point (i.e., the Abbe arm).

Therefore, in a further aspect the method is characterized in that the method further comprises measuring a first shift of an image of the at least one diffraction order generated by a first incoming beam on the at least one grating as a function of a tilt applied to the at least one grating, measuring a second shift of an image of the at least one diffraction order generated by a second incoming beam on the at least one grating as a function of a tilt applied to the at least one grating, such that the second incoming beam has a different diameter than the first incoming beam. The method further comprises determining from the first and second shift, a value of a defocus of the at least one grating and determining from the value of the defocus a value of an Abbe arm, the Abbe arm being a distance between a surface comprising the at least one grating and a position of a pivot for the tilt.

Furthermore, it is noted that a similar broadening effect can be brought about by changing the length size of the grating (i.e., in the direction in which the periodic structure is repeated in the grating).

Therefore, in a further aspect the method of the present invention is further characterized in that the first shift of the image of the at least one diffraction order is generated on the at least one grating of a first type as a function of a tilt applied to the at least one grating of the first type, the second shift of the image of the at least one diffraction order is generated on the at least one grating of a second type as a function of a tilt applied to the at least one grating of the second type, the at least one grating of the first type having a first diffracting length substantially smaller than the beam size of the incoming optical beam, and the at least one grating of the second type having a second diffracting length being substantially larger than the first diffracting length.

For a fixed periodicity and a constant beam diameter, a diffracted beam generated by the illuminating beam on a small marker i.e., a relatively small grating with a given periodicity, will be broader than a diffracted beam generated on a large marker, i.e., a relatively larger grating with the same periodicity.

The method according to present invention allows measuring a defocus of an alignment system and/or the wafer marker pivot point (i.e., the Abbe arm), by variation of the incoming beam size.

Therefore, in still a further aspect the method of the present invention is further characterized in that the first shift of the image of the at least one diffraction order is generated by a first incoming beam on the at least one grating as a function of a tilt applied to the at least one grating, and the second shift of the image of the at least one diffraction order is generated by a second incoming beam on the at least one grating as a function of a tilt applied to the at least one grating; the second incoming beam having a different diameter than the first incoming beam.

Although specific reference may be made in this text to the use of the apparatus according to the invention in the manufacture of ICs, it should be explicitly understood that such an apparatus has many other possible applications. For example, it may be employed in the manufacture of integrated optical systems, guidance and detection patterns for magnetic domain memories, liquid-crystal display panels, thin-film magnetic heads, etc. The person skilled in the art will appreciate that, in the context of such alternative applications, any use of the terms "reticle", "wafer" or "die" in this text should be considered as being replaced by the more general terms "mask", "substrate" and "target portion", respectively.

In the present document, the terms "radiation" and "projection beam" are used to encompass all types of electromagnetic radiation, including ultraviolet (UV) radiation (e.g. with a wavelength of 365, 248, 193, 157 or 126 nm) and extreme ultra-violet (EUV) radiation (e.g. having a wavelength in the range 5–20 nm).

BRIEF DESCRIPTION OF DRAWINGS

Below, the invention will be explained with reference to some drawings, which are intended for illustration purposes only and not to limit the scope of protection as defined in the accompanying claims.

DETAILED DESCRIPTION OF THE INVENTION

Lithographic Apparatus

Figure 1:
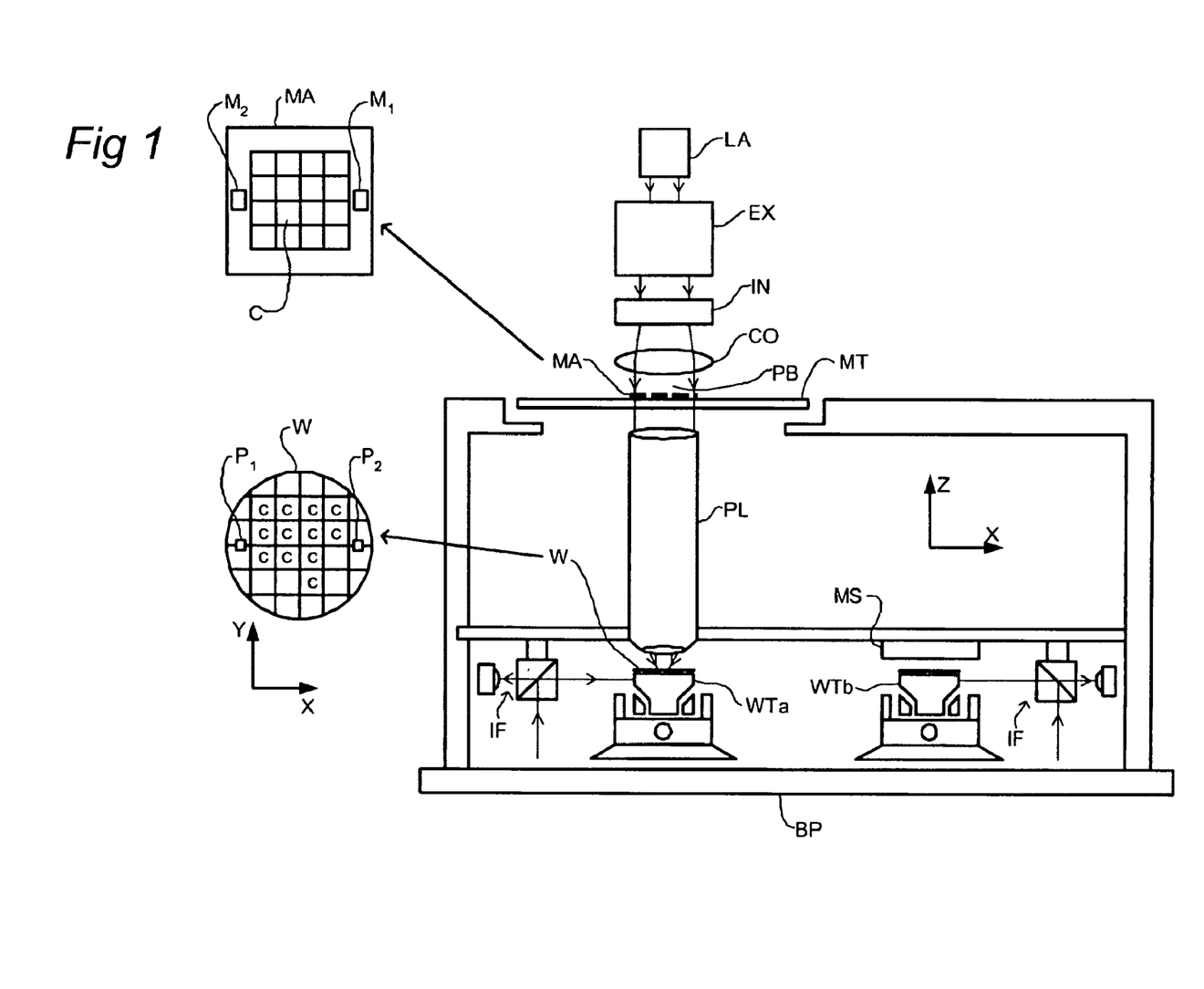
FIG. 1 depicts a lithographic apparatus.

FIG. 1 schematically depicts a lithographic apparatus 1 according to a particular embodiment of the invention. The apparatus is of the type having two substrate tables WTa and WTb, and comprises:

- a radiation system Ex, IL: for supplying a projection beam PB of radiation (e.g. UV, EUV, laser, etc.). In this particular case, the radiation system also comprises a radiation source LA;
- a first object table (mask table) MT: provided with a mask holder for holding a mask MA (e.g. a reticle), and connected to first positioning mechanism PM for accurately positioning the mask with respect to item PL;
- a second and third object table (substrate tables or holders) WTa and WTb: each provided with a substrate holder for holding a substrate W (e.g. a resist-coated silicon wafer), and each connected to respective table positioning mechanism (not shown), the second object table being positioned below the projection system PL with its table positioning mechanism arranged for accurately positioning the substrate with respect to item PL and the third object table being positioned below a measurement system MS with its table positioning mechanism arranged for accurately positioning the substrate with respect to item MS;
- a projection system ("lens") PL: for imaging an irradiated portion of the mask MA onto a target portion C (e.g. comprising one or more dies) of the substrate W.

As here depicted, the apparatus is of a transmissive type (i.e. has a transmissive mask). However, in general, it may also be of a reflective type, for example (with a reflective mask). Alternatively, the apparatus may employ another kind of patterning device, such as a programmable mirror array of a type as referred to above.

The source LA (e.g. a mercury lamp or an excimer laser) produces a beam of radiation. This beam is fed into an illumination system (illuminator) IL, either directly or after having traversed conditioning mechanism, such as a beam expander Ex, for example. The illuminator IL may comprise adjusting mechanism AM for setting the outer and/or inner radial extent (commonly referred to as σ-outer and σ-inner, respectively) of the intensity distribution in the beam. In addition, it will generally comprise various other components, such as an integrator IN and a condenser CO. In this way, the beam PB impinging on the mask MA has a desired uniformity and intensity distribution in its cross-section.

It should be noted with regard to FIG. 1 that the source LA may be within the housing of the lithographic apparatus (as is often the case when the source LA is a mercury lamp, for example), but that it may also be remote from the lithographic apparatus, the radiation beam which it produces being led into the apparatus (e.g. with the aid of suitable directing mirrors); this latter scenario is often the case when the source LA is an excimer laser. The current invention and claims encompass both of these scenarios.

The beam PB subsequently intercepts the mask MA, which is held on a mask table MT. Having traversed the mask MA, the beam PB passes through the lens PL, which focuses the beam PB onto a target portion C of the substrate W. With the aid of the second positioning mechanism PW and interferometric measuring mechanism, the substrate table WTa can be moved accurately, e.g. so as to position different target portions C in the path of the beam PB. Similarly, the first positioning mechanism PM can be used to accurately position the mask MA with respect to the path of the beam PB, e.g. after mechanical retrieval of the mask MA from a mask library, or during a scan.

In general, movement of the object tables MT, WTa will be realized with the aid of a long-stroke module and a short-stroke module, which are not explicitly depicted in FIG. 1. However, in the case of a wafer stepper (as opposed to a step-and-scan apparatus) the mask table MT may just be connected to a short stroke actuator, or may be fixed. Mask MA and substrate W may be aligned using mask alignment marks M1, M2 and substrate alignment marks P1, P2. The measurement system MS is arranged as wafer alignment system and is schematically depicted. The wafer alignment system is capable of mapping deviations of a wafer surface by sensing markers with respect to at least their deviations in the XY. For the purpose of alignment an optical alignment beam (not shown) is running between the wafer alignment system MS and the markers on the wafer W located on substrate table WTb.

The depicted apparatus can be used in different modes:

step mode: the mask table MT is kept essentially stationary, and an entire mask image is projected in one go (i.e. a single "flash") onto a target portion C. The substrate table WT is then shifted in the X and/or Y directions so that a different target portion C can be irradiated by the beam PB;

scan mode; essentially the same scenario applies, except that a given target portion C is not exposed in a single "flash". Instead, the mask table MT is movable in a given direction (the so-called "scan direction", e.g. the Y-direction) with a speed v, so that the projection beam PB is caused to scan over a mask image; concurrently, the substrate table WT is simultaneously moved in the same or opposite direction at a speed V=M v, in which M is the magnification of the lens PL (typically, M=¼ or ⅕). In this manner, a relatively large target portion C can be exposed, without having to compromise on resolution; and other mode: the mask table MT is kept essentially stationary holding a programmable patterning device, and the substrate table WT is moved or scanned while a pattern imparted to the projection beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

The interferometric measuring mechanism comprises a light source such as a laser (not shown) and one or more interferometers for determining some information (e.g., position, alignment, etc.) of a substrate or a stage. In FIG. 1, for example, includes two interferometers are schematically depicted by item IF. The laser produces a metrology beam MB which is routed to the interferometer(s) IF by a beam manipulator. In case more than one interferometer is present, the metrology beam is shared between them, by using optics that split the metrology beam in various separate beams for each interferometer. FIG. 1 shows a metrology beam split in two beams. The splitter optics are not shown.

Wafer Alignment System

Figure 2:
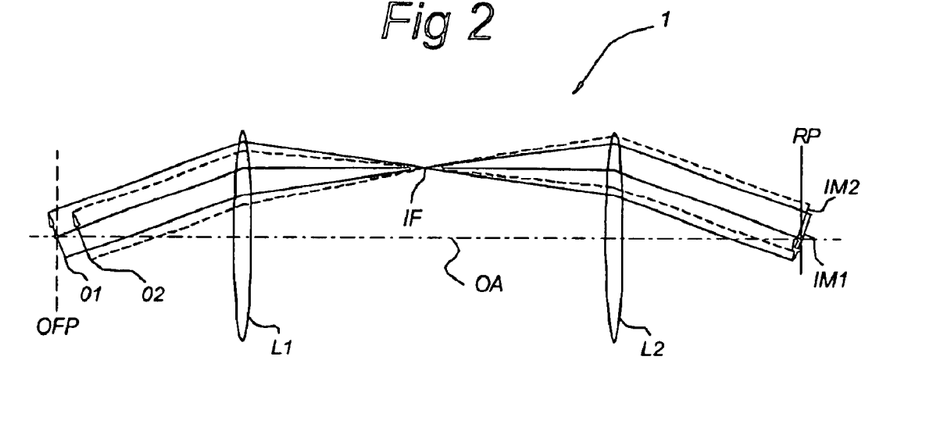
FIG. 2 schematically shows an optical device as used in a wafer alignment system of a lithographic apparatus.

FIG. 2 schematically shows an optical device in a wafer alignment system of a lithographic apparatus. The optical device used in a wafer alignment system of a lithographic apparatus relates to a Keplerian telescope 1. The Keplerian telescope 1 comprises a first lens L1 with a first focus, and a second lens L2 with a second focus. In the telescope both the first and second lens L1, L2 are converging lenses. First and second lenses L1, L2 are arranged on optical axis OA. For reasons of clarity, only rays that are emitted perpendicularly to the object surface are shown.

In use, a first object O1 which is located in the object plane OFP is imaged as a first image IM1 on a reference plane RP due to setting the distance of the object plane OFP equal to the distance of the first focus, and the distance of the reference plane RP relative to the second lens L2, equal to the second focus. In between the two lenses L1, L2 an intermediate focus IF exists by setting the distance of the first and second lens L1, L2 relative to each other equal to the summed distance of the first and second focus: focal plane of first lens L1 substantially coincides with focal plane of second lens L2.

A second object O2 which is located outside the object plane (i.e. having a defocus) is imaged as a second image IM2 on the reference plane RP, by using the same configuration of the lenses L1, L2 as for the object O1.

Both the first and second object O1, O2 which have identical shapes (depicted here as arrows), have a tilt as schematically indicated. From the schematic construction of the image of the first and second object O1, O2, respectively, it can be derived that the image of an object which has a defocus relative to the object plane OFP (such as image IM2 of second object O2) and is projected on the reference plane RP, will display a shift in the reference plane RP. Thus, any information relating to the position of the image IM2 will comprise some error due to the defocus of second object O2.

Figure 3:
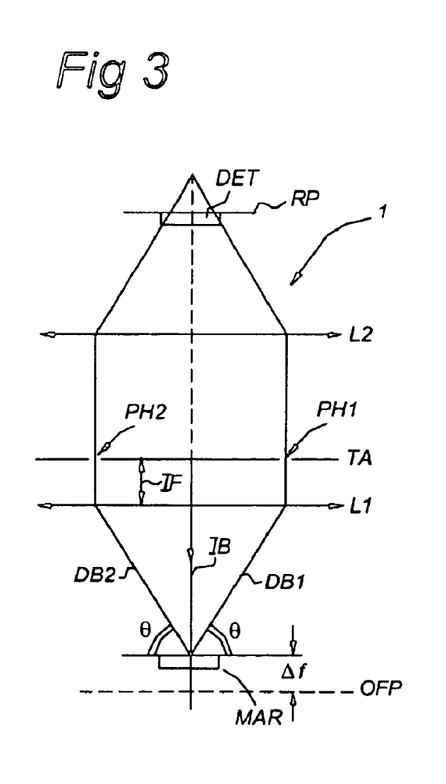
FIG. 3 schematically shows the optical device of FIG. 2 during alignment of an untilted marker on a substrate.

FIG. 3 schematically shows the optical device of FIG. 2 during alignment of an untilted marker on a substrate. In FIG. 3 the optical device 1 of FIG. 2 is shown while a telecentric aperture TA is positioned at substantially the position of the intermediate focus IF. In the reference plane RP, a detector DET is located for detecting an optical signal from one or more light beams impinging on the detector DET. The detector DET is arranged for measuring the location of the optical signal on it, for example by an array of photosensitive elements.

An incoming optical beam IB impinges substantially perpendicularly on the surface of a marker MAR whose position is shifted vertically relative to the object plane OFP. The incoming optical beam IB may comprise as light source a single laser beam or if required multiple laser beams, i.e. the beam IB may comprise electromagnetic radiation of one or more wavelengths (colors).

Due to the interaction between the incoming beam IB and the lateral periodicity (or periodic distance) of the marker (i.e. grating), a plurality of diffracted beams are generated at the position of the marker MAR, of which beams here a single diffraction order is shown as indicated by the right-hand side diffracted beam DB1 and the left-hand side diffracted beam DB2. Both beams DB1, DB2 are directed under a diffraction angle $\theta$ with the surface comprising the marker MAR.

In the first lens L1, the beams are refracted and focused at the intermediate focus IF. Telecentric aperture TA at the position of the intermediate focus IF comprises at predetermined locations where the foci of the generated diffracted beams DB1, DB2 are expected, pinholes PH1, PH2 for allowing passage of the respective diffracted beams DB1, DB2. Typically, the diameter size of the diffracted beams DB1, DB2 at the intermediate focus IF is of the same order or smaller as the diameter size of the respective pinhole PH1, PH2.

After passing the respective pinhole each of the diffracted beams is refracted by the second lens L2 and due to interference of the two diffracted beams DB1, DB2, an optical signal of the diffraction order is focused and detected on a detector DET in the reference plane RP.

Persons skilled in the art will appreciate that, in spite of the fact that the marker MAR is positioned at a defocus $\Delta f$ relative to the object plane OFP, the diffracted beams are still properly aimed at the detector DET, due to the fact that the surface of the marker is tilt-free (i.e. parallel to the object plane OFP).

Figure 4:
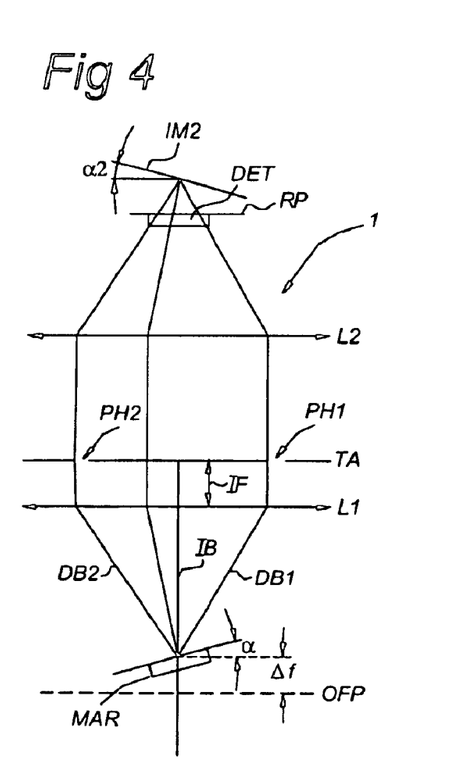
FIG. 4 schematically shows the optical device of FIG. 2 during alignment of a tilted marker on a substrate.

FIG. 4 schematically shows the optical device 1 during alignment of a tilted marker on a substrate. In FIG. 4 the optical device 1 as shown in FIG. 3 is now shown for a marker which is tilted relative to incoming beam IB. Again, a plurality of diffracted beams is generated by the interaction of the incoming beam and the periodicity of the marker MAR. The marker MAR is tilted with respect to the incoming beam IB over an angle $\alpha$. Also, the marker MAR has a defocus $\Delta f$ from the object plane OFP.

To a first order approximation, the diffraction angle $\theta$ of a diffracted beam on the tilted marker MAR (relative to the surface normal of the marker) will be equal to the diffraction angle for the zero-tilt marker MAR as shown in FIG. 3. Due to the tilt angle $\alpha$, the diffracted beams DB1, DB2 comprise an offset angle (equal to tilt angle $\alpha$). Schematically, the image IM2 of the marker is shown. IM2 displays a tilt angle $\alpha 2$.

Due to the fact that at the level of the aperture and pinholes, the diffracted beams have a smaller diameter than the pinholes, the detection of optical signals is sensitive to tilt of the marker MAR.

Embodiments

Figure 5:
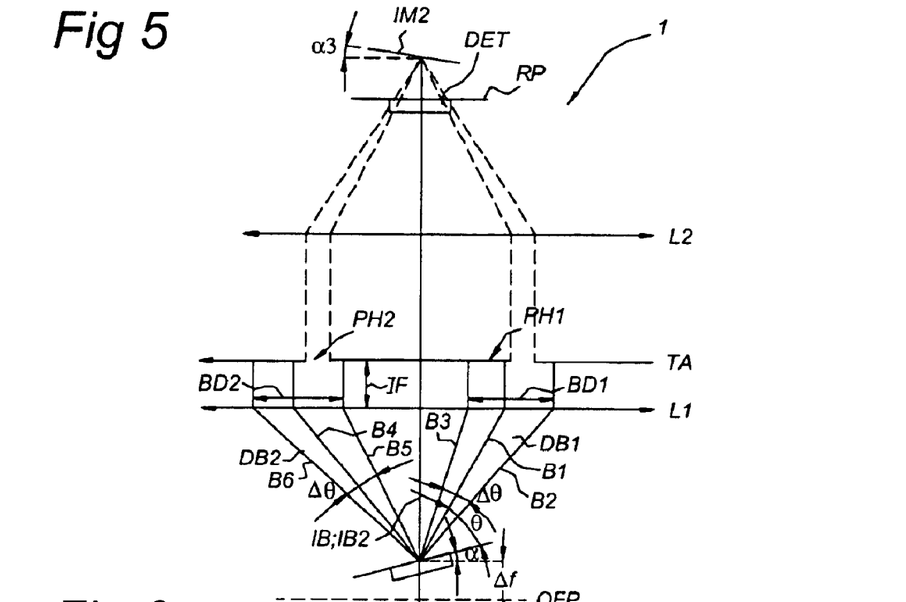
FIG. 5 schematically shows the optical device as used in a wafer alignment system of a lithographic apparatus during alignment of a tilted marker on a substrate, in accordance with the present invention.

FIG. 5 schematically shows the optical device as used in a wafer alignment system of a lithographic apparatus during alignment of a tilted marker on a substrate, in accordance with the present invention.

For detecting the diffracted beams, typically it is sufficient to have a measurable signal on the detector DET. It is, however, required that for each diffracted order an image can be formed on the detector on the reference plane RP, even if the marker MAR to be measured is tilted relative to the incoming beam IB. The present invention is based on the insight that the tilt-sensitivity of detection of a signal passing the optical device 1 can be reduced without the effort of more precise calibration by providing diffracted beams which are broader (at the level of the telecentric aperture TA) than the size of the pinhole diameter.

FIG. 5 shows an embodiment according to the present invention in which the incoming beam IB is a small incoming beam IB2. Due to the effect that only a finite size of the grating of the marker MAR is involved in the diffraction process, the diffracted beams are spatially broadened around their respective diffraction angle. In FIG. 5 the broadening to the finite size effect resulting from the beam size is schematically illustrated by the diffracted beams DB1, DB2, which each are illustrated by a central beam B1, and B4 respectively, with a broadening to the boundaries B2, B3 and B5, B6, respectively. The central beam B1, B4 still has a diffraction angle θ. The broadening leads to a broadening angle Δθ.

The interaction between pinhole PH1, PH2 and broadened beam DB1, DB2 is indicated by dashing of the beams between the aperture TA and the detector array DET. The diffracted beam diameter at the telecentric aperture or pinhole level BD1, BD2 is indicated in FIG. 5. Note that due to the tilt of the marker MAR, BD1 and BD2 differ slightly.

As shown in FIG. 5, if the marker is tilted over an angle α, then due to the broadening still a part of the diffracted beams DB1, DB2 may pass the telecentric aperture TA through the respective pinhole PH1, PH2, and a signal can be detected on the reference plane RP due to the interference of the diffracted beams DB1, DB2. It will be appreciated that, in the present invention, the detected signal significantly change less when the marker is tilted than in the prior art. As a result of the broadening effect, the sensitivity of the detection with respect to tilt of the marker MAR is advantageously reduced.

Alternatively, the broadening effect may be effectuated also by using pinholes with a diameter smaller than the diffracted beam diameter.

Note that in FIG. 5 still a defocus is present. The image IM2 still displays a tilt with an angle α3. however, the tilt α3 of the image is smaller than the tilt a of the marker MAR. By consequence, α3 of FIG. 5 is also smaller than α2 as displayed in FIG. 4 for a system of the prior art.

Furthermore, it is noted that the present invention in basically the same manner provides a solution for correction of a tilt of an incoming laser beam IB which would cause a similar undesired effect as a tilted marker. In many circumstances an adjustment of a tilt of an incoming laser beam may be considerably harder to achieve than an adjustment through a finite size effect. The present invention comprises a correction mechanism which is capable of reducing the effect brought about by either a tilt of a marker or a tilt of the incoming laser beam. The sensitivity of the wafer alignment system in respect of a tilt of the incoming laser beam may thus also be significantly reduced in a similar manner.

Figure 6:
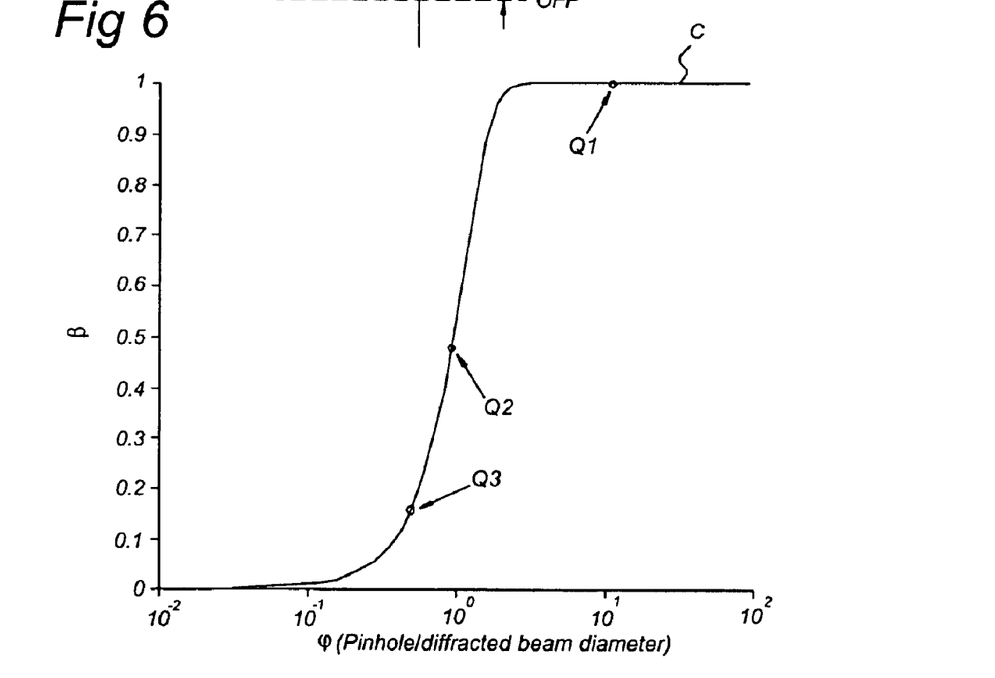
FIG. 6 shows a diagram of the sensitivity of detection to tilt of a wafer in connection to the use of the present invention.

FIG. 6 shows a diagram of the sensitivity of detection to tilt of a wafer in connection to the use of the present invention.

In the diagram of FIG. 6, the shift of the image position as a function of the pinhole size is shown as follows. On the vertical axis, as indicated by parameter β, which denotes the effective (or apparent) tilt of the marker image relative to tilt angle α, the shift of the position of image IM2 on the reference plane RP is indicated relative to the tilt angle α. With reference to FIG. 5, the tilt angle α3 of image IM2 equals β×α. On the horizontal axis as indicated by parameter φ, the pinhole size relative to the diffracted beam diameter BD1, BD2 at the level of the telecentric aperture (or actually, the level of the pinhole PH1, PH2) is indicated. Curve C is an example of a calculated curve for the relation between the relative position shift and the relative pinhole diameter assuming a Gaussian diffracted beam profile. It is noted that other beam profiles are possible which would result in a different relation between the relative position shift and the relative pinhole diameter.

In curve C three points are indicated that specify typical arrangements of wafer alignment systems. Point Q1 displays a tilt sensitivity near unity for a wafer alignment system where the ratio of the diameter of the pinhole PH1, PH2 over the diameter of the diffracted beam IB (at the level of the telecentric aperture TA) is larger than unity. In a typical arrangement, the pinhole diameter is about 500 μm and the beam diameter is about 700 μm (at the level of the grating (MAR)), but after passing lens L1 the diffracted beam is focused to a value much smaller than 500 μm, typically about 50–100 μm. Here relatively sharp diffraction beams are generated on the marker's grating, which results in a strong sensitivity (value 1) of the shift of the image IM2 of a defocused object O2 on the tilt of the marker MAR.

Point Q2 relates to an arrangement where the ratio of beam diameter over pinhole size is approximately unity, and point Q3 relates to an arrangement with the ratio of pinhole size over diffracted beam diameter (at the level of the telecentric aperture TA) being smaller than unity. In the arrangements of Q2 and Q3 the diffracted beams are broadened due to the finite beams size effect which results in a relatively lower sensitivity to tilt of a marker. Note that for points Q2 and Q3, only a small portion of the grating is illuminated by the laser beam and the diffraction length on the grating in which the diffracted beams are generated is small. The periodicity of the grating is typically 16 μm. According to the curve C, the arrangement of Q2 has a sensitivity which is about 50% of the sensitivity of Q1. The arrangement of Q3 is approximately 5 times less sensitive to tilt of a marker than the arrangement Q1.

In view of this, the present invention provides a position error of about 2 μm/degree of tilt for a β value about 0.5 (typically 10 nm at α=100 μrad) and about 400 nm/degree of tilt for a β value of about 0.1 (typically 2 nm at α=100 μrad), respectively. It has been found in practice that the tilt sensitivity can be reduced to a β value significantly lower than '1', typically less than 0.25 and 0.01, thus to a tilt sensitivity value between about 875 nm/degree and about 20 nm/degree.

A wafer onto which a pattern is to be projected must be tilted relative to the optical axis OA over an angle to correct for a possible curvature of the wafer. The vertical distance between the wafer surface and a lateral pivot of the wafer stage WS (for tilting) must be determined to allow correction for horizontal displacement (thus, defocus) that occurs during the tilt of the wafer table. This distance is known as the Abbe arm.

In a lithographic apparatus using a single (wafer) stage for patterning and measuring wafer positions (as in a wafer alignment system MS), correction can be achieved by determining the Abbe arm during a calibration. Typically, such a calibration is done by measuring an image shift (denoted as Δx) in a direction x in the reference plane as a function of wafer stage tilt (denoted as $\Delta R_{y,\,ws}$) around an axis y of the lateral pivot of the wafer stage, in a direction perpendicular to the direction x. From the image shift the Abbe arm ($a_{Abbe}$) is derived using the following equation:

$$\Delta x = \Delta R_{y,WS} \cdot a_{Abbe} \tag{1}$$

Persons skilled in the art will note that due to the Abbe arm, a diffraction order imaged from a marker on a tilted wafer will show a displacement in the object that can not be distinguished in a projection of an image of that object from the response of the image on defocus and local tilt of that object. In relation to the imaging of diffraction orders of grating: the image of the diffraction order will display an image shift which varies as a function of the applied wafer tilt $\Delta R_{y,WS}$. This image shift disadvantageously affects the overlay of subsequent patterns and deteriorates the performance of the lithographic apparatus.

Based on the observation of the preceding paragraph, the image shift of a marker object due to defocus and wafer-wide tilt has the same functional form:

$$\Delta x = 2\Delta R_{y,WS} \cdot \Delta f \qquad (2),$$

where $\Delta f$ is the defocus.

In this linear superposition, the two effects (Abbe displacement and defocus) can not be separated. At least one of the two effects must be quantified (independently) to obtain a value for the other. Typically, at a number of vertical displacements of the wafer stage from the projection lens a series of wafer tilts is measured. From such measurements the defocus can be derived and consequently the value of the Abbe arm is known.

The Abbe arm may be determined by a conventional technique as described above. In this situation, for Abbe calibration a dedicated Abbe arm measurement device (as disclosed in U.S. Publication 2001/0008723 A1) may be used, which is relatively cost-ineffective.

As will be explained below, the present invention provides a solution, wherein the use of such dedicated measuring device can be omitted altogether.

During wafer alignment measurement in the wafer alignment system MS of a two stage system, the image shift observed as a function of wafer tilt is given by the superposition of equations (1) and (2):

$$\Delta x = \Delta R_{y,WS} \cdot a_{Abbe} + 2\Delta R_{y,WS} \cdot \Delta f \qquad (3)$$

In the present invention, the tilt sensitivity as a function of beam broadening is used to separate the dependency of the image shift of a marker on Abbe arm and on defocus.

As depicted in FIG. 6, the tilt sensitivity parameter $\beta$ varies with the broadening of the diffraction beams as generated by (the diameter of) the incoming beam IB2 of the wafer alignment system MS.

It is noted that a similar broadening effect can be brought about by changing the length size of the grating (i.e., in the direction in which the periodic structure is repeated in the grating) which is illuminated by an incoming beam IB, IB2. For a fixed periodicity and a constant beam diameter, a diffracted beam generated by the incoming beam on a small marker i.e., a relatively small grating with a given periodicity, will be broader than a diffracted beam generated on a large marker, i.e., a relatively larger grating with the same periodicity.

Thus, in a wafer alignment system MS which uses a telecentric aperture TA such as shown in the foregoing figures, the tilt sensitivity of markers will vary with the marker size. As explained above, a sharper diffraction beam will show a higher tendency to display a shift of the intensity gravity center when the marker is tilted than a broader diffraction beam.

Figure 7:
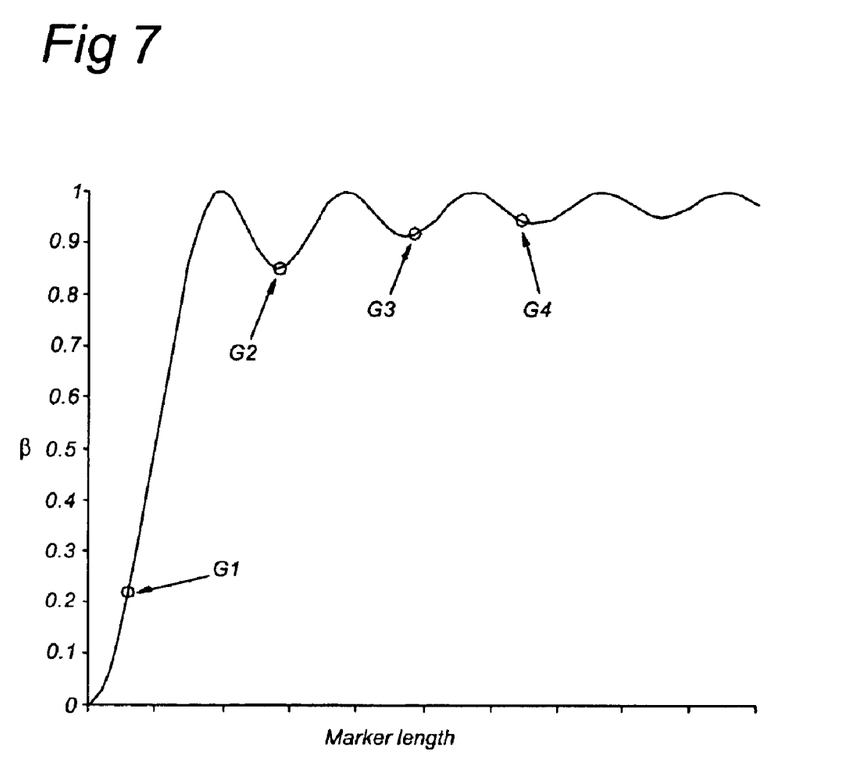
FIG. 7 shows a diagram of relative tilt sensitivity as a function of marker length.

For relatively large markers (comprising relatively many periodic structures of a given periodicity) the tilt sensitivity (denoted here as $\beta_L$) is larger than for relatively smaller markers (with fewer periodic structures of the same periodicity) which is denoted here as $\beta_S$. FIG. 7 shows a diagram of relative tilt sensitivity as a function of marker length. On the horizontal axis the marker size is plotted, on the vertical axis the tilt parameter $\beta$ is plotted. In this exemplary diagram, $\beta$ is calculated from first principles as a function of marker size for a marker periodicity of 16 $\mu$m. In the plot, experimental values for four different marker sizes are indicated.

For relatively large markers equation (3) now becomes:

$$\Delta x_L = \Delta R_{y,WS} \cdot a_{Abbe} + 2\beta_L \Delta R_{y,WS} \cdot \Delta f \qquad (4),$$

and for small markers:

$$\Delta x_S = \Delta R_{y,WS} \cdot a_{Abbe} + 2\beta_S \Delta R_{y,WS} \cdot \Delta f \qquad (5).$$

By performing calibration measurements at various vertical displacements between wafer stage and projection lens at known $\beta_L$ and $\beta_S$ (where $\beta_L \neq \beta_S$), the dependency of the image shift $\Delta x_L$ and $\Delta x_S$ on the Abbe arm can be eliminated. Due to this elimination, from these measurements the image shift $\Delta x$ as a function of tilt remains and the defocus $\Delta f$ can be determined. Next, by using the determined value of the defocus $\Delta f$, the wafer alignment system can perform measurements according to equations (3), (4) or (5) (depending on which relative marker size is used) to obtain the value of the Abbe arm for the wafer on that particular wafer stage WS.

From the equations (4) and (5) it can be argued that the influence on image shift is similar in relation to the effect of defocus and of Abbe arm, determination of only one of the two effects can be done without explicitly determining the other.

It is noted that the effect of broadening a diffracted beam by the marker size may also be achieved by manipulating the incoming beam IB, IB2 to change it's beam shape, i.e., by being internally parallel, convergent or divergent, or to change it's diameter. It is noted that this alternative may require more effort than by the two alternatives described above.

Whilst specific embodiments of the invention have been described above, it will be appreciated that the invention may be practiced otherwise than as described. As such, the description is not intended to limit the invention. The configuration, operation, and behavior of the present invention has been described with the understanding that modifications and variations of the embodiments are possible, given the level of detail present herein. Thus, the preceding detailed description is not meant or intended to, in any way, limit the invention—rather the scope of the invention is defined by the appended claims.

What is claimed is:

1. A lithographic apparatus comprising:

a radiation system for providing a beam of radiation;

a patterning device to impart a desired pattern onto said beam of radiation along its cross-section;

a substrate holder for holding a substrate;

a projection system for projecting said patterned beam of radiation onto a target portion of said substrate; and a substrate alignment system for detecting a position of said substrate relative to a position of said patterning device, said substrate alignment system comprising:

a source configured to generate an incoming optical beam, at least one grating, provided on said substrate, having a diffraction length, said at least one grating configured to generate at least one diffraction order of constituent diffracted beams based on an interaction with said incoming optical beam over said diffracting length, and an optical device configured to image said at least one diffracted order on a sensor device, wherein said optical device includes an aperture at a predetermined location to allow said constituent diffracted beams to pass through, and wherein said optical device is arranged to broaden said constituent diffracted beams such that a beam diameter of said constituent diffracted beams is larger than a diameter of said aperture.

2. The lithographic apparatus of claim 1, wherein said optical device comprises mechanism for generating a reduced incoming optical beam based on said incoming optical beam, said reduced incoming optical beam having a reduced beam size which illuminates a portion of said grating.

3. The lithographic apparatus of claim 2, wherein said beam size of said reduced incoming optical beam is smaller than said portion of said grating.

4. The lithographic apparatus of claim 3 wherein said optical device is configured to have a position error less than 2.0 $\mu$m/degree of tilt.

5. The lithographic apparatus of claim 3, wherein said optical device is configured to have a position error less than 400 nm/degree of tilt.

6. The lithographic apparatus of claim 1, wherein said optical device comprises a first type of said at least one grating having a first diffracting length substantially smaller than said beam size of said incoming optical beam.

7. The lithographic apparatus of claim 6, wherein said optical device further comprises a second type of said at least one grating having a second diffracting length being substantially larger than said first diffracting length.

8. The lithographic apparatus of claim 7, wherein said optical device is configured to have a position error less than 2.0 $\mu$m/degree of tilt.

9. The lithographic apparatus of claim 7, wherein said optical device is configured to have a position error less than 400 nm/degree of tilt.

10. A substrate alignment method, comprising:
configuring a beam of radiation with a desired pattern in its cross-section based on a patterning device;
providing a substrate; and
detecting a position of said substrate relative to a position of said patterning device by:
generating an incoming optical beam,
providing at least one grating, on said substrate, having a diffracting length, said at least one grating generating at least one diffraction order of constituent diffracted beams based on an interaction with said incoming optical beam over said diffracting length,
imaging said at least one diffraction order on a sensor device,
positioning an aperture at a predetermined location to allow said constituent diffracted beams to pass through, and
broadening said constituent diffracted beams such that a beam diameter of said constituent diffracted beams is larger than a diameter of said aperture.

11. The substrate alignment method of claim 10, further including:
measuring a first shift of an image of said at least one diffraction order generated on said at least one grating of a first type as a function of a tilt applied to said at least one grating of said first type;
measuring a second shift of an image of said at least one diffraction order generated on said at least one grating of a second type as a function of a tilt applied to said at least one grating of said second type;

determining from said first shift and said second shift a value of a defocus of said at least one gratings of said first type and said second type; and determining from said value of said defocus a value of an Abbe arm, said Abbe arm being a distance between a surface comprising said at least one grating of said first and second type and a position of a pivot for said tilt.

12. The substrate alignment method of claim 11, further including:
generating said first shift of said image of said at least one diffraction order by a first incoming beam on said at least one grating as a function of a tilt applied to said at least one grating, and
generating said second shift of said image of said at least one diffraction order by a second incoming beam on said at least one grating as a function of a tilt applied to said at least one grating,
wherein said second incoming beam is configured to have a different diameter than said first incoming beam.

13. The substrate alignment method of claim 11, further including:
generating said first shift of said image of said at least one diffraction order on said at least one grating of a first type as a function of a tilt applied to said at least one grating of said first type;
generating said second shift of said image of said at least one diffraction order on said at least one grating of a second type as a function of a tilt applied to said at least one grating of said second type;
wherein said at least one grating of said first type is configured with a first diffracting length that is substantially smaller than said beam size of said incoming optical beam, and
wherein said at least one grating of said second type is configured with a second diffracting length that is substantially larger than said first diffracting length.

14. A device manufacturing method comprising:
providing a beam of radiation;
configuring said beam of radiation with a desired pattern in its cross-section based on a patterning device;
providing a substrate;
projecting the patterned beam of radiation onto a target portion of said substrate; and
detecting a position of said substrate relative to a position of said patterning device by:
generating an incoming optical beam,
providing at least one grating, on said substrate, having a diffracting length, said at least one grating generating at least one diffraction order of constituent diffracted beams based on an interaction with said incoming optical beam over said diffracting length,
imaging said at least one diffraction order on a sensor device,
positioning an aperture at a predetermined location to allow said constituent diffracted beams to pass through, and
broadening said constituent diffracted beams such that a beam diameter of said constituent diffracted beams is larger than a diameter of said aperture.

15. The device manufacturing method of claim 14, further including:
measuring a first shift of an image of said at least one diffraction order generated on said at least one grating of a first type as a function of a tilt applied to said at least one grating of said first type;

measuring a second shift of an image of said at least one diffraction order generated on said at least one grating of a second type as a function of a tilt applied to said at least one grating of said second type;

determining from said first shift and said second shift a value of a defocus of said at least one gratings of said first type and said second type; and determining from said value of said defocus a value of an Abbe arm, said Abbe arm being a distance between a surface comprising said at least one grating of said first and second type and a position of a pivot for said tilt.

16. The device manufacturing method of claim 15, further including:

generating said first shift of said image of said at least one diffraction order by a first incoming beam on said at least one grating as a function of a tilt applied to said at least one grating, and generating said second shift of said image of said at least one diffraction order by a second incoming beam on said at least one grating as a function of a tilt applied to said at least one grating, wherein said second incoming beam is configured to have a different diameter than said first incoming beam.

17. The device manufacturing method of claim 14, further including:

generating said first shift of said image of said at least one diffraction order on said at least one grating of a first type as a function of a tilt applied to said at least one grating of said first type;

generating said second shift of said image of said at least one diffraction order on said at least one grating of a second type as a function of a tilt applied to said at least one grating of said second type;

wherein said at least one grating of said first type is configured with a first diffracting length that is substantially smaller than said beam size of said incoming optical beam, and wherein said at least one grating of said second type is configured with a second diffracting length that is substantially larger than said first diffracting length.

18. A lithographic alignment system for detecting a position of a substrate relative to a position of a patterning device, comprising:

a source configured to generate an incoming optical beam, at least one grating, provided on said substrate, having a diffracting length, said at least one grating configured to generate at least one diffraction order of constituent diffracted beams based on an interaction with said incoming optical beam over said diffracting length, and an optical device configured to image said at least one diffraction order on a sensor device, wherein said optical device includes an aperture at a predetermined location to allow said constituent diffracted beams to pass through, and wherein said optical device is arranged to broaden said constituent diffracted beams such that a beam diameter of said constituent diffracted beams is larger than a diameter of said aperture.

19. The lithographic alignment system of claim 18, wherein said optical device comprises mechanism for generating a reduced incoming optical beam based on said incoming optical beam, said reduced incoming optical beam having a reduced beam size which illuminates a portion of said grating.

20. The lithographic alignment system of claim 19, wherein said beam size of said reduced incoming optical beam is smaller than said portion of said grating.

21. The lithographic alignment system of claim of claim 20, wherein said optical device is configured to have a position error less than 2.0 $\mu$m/degree of tilt.

22. The lithographic alignment system of claim of claim 20, wherein said optical device is configured to have a position error less than 400 nm/degree of tilt.

23. The lithographic alignment system of claim 18, wherein said optical device comprises a first type of said at least one grating having a first diffracting length substantially smaller than said beam size of said incoming optical beam.

24. The lithographic alignment system of claim 23, wherein said optical device further comprises a second type of said at least one grating having a second diffracting length being substantially larger than said first diffracting length.

25. The lithographic alignment system of claim 24, wherein said optical device is configured to have a position error less than 2.0 $\mu$m/degree of tilt.

26. The lithographic alignment system of claim 24, wherein said optical device is configured to have a position error less than 400 nm/degree of tilt.

* * * * *